(12) United States Patent
Rossini et al.

(10) Patent No.: US 6,776,928 B2
(45) Date of Patent: Aug. 17, 2004

(54) CONDUCTIVE COATING COMPOSITION

(75) Inventors: Tullio Rossini, Como (IT); Franco Folcio, Canzo Co (IT); Corrado Dotti, Maslianico Co (IT)

(73) Assignee: Akzo Nobel N.V., Arnhem (NL)

( * ) Notice: Subject to any disclaimer, the term of this patent is extended or adjusted under 35 U.S.C. 154(b) by 0 days.

(21) Appl. No.: 10/059,704

(22) Filed: Jan. 29, 2002

(65) Prior Publication Data

US 2003/0042467 A1 Mar. 6, 2003

(Under 37 CFR 1.47)

(30) Foreign Application Priority Data

Jan. 29, 2001 (EP) ............................................ 01200314

(51) Int. Cl.$^7$ .............................. C09D 5/24; H01B 1/10
(52) U.S. Cl. ....................... 252/503; 252/500; 252/511; 252/521.2; 428/685; 420/34; 423/493
(58) Field of Search ................................ 252/500, 501, 252/511, 521.2, 503; 423/493; 420/10, 11, 15, 16, 17, 34; 428/685; 106/645

(56) References Cited

U.S. PATENT DOCUMENTS

| | | | | |
|---|---|---|---|---|
| 5,085,931 A | * | 2/1992 | Boyer et al. ................ | 428/328 |
| 5,206,073 A | * | 4/1993 | Suzuki ..................... | 428/195.1 |
| 5,447,791 A | | 9/1995 | Cunningham et al. ...... | 428/327 |
| 5,556,576 A | | 9/1996 | Kim et al. .................. | 252/511 |

FOREIGN PATENT DOCUMENTS

| | | | | |
|---|---|---|---|---|
| EP | 286 168 | | 10/1988 | ............ C08J/5/04 |
| EP | 367 224 A3 | | 5/1990 | ............ H01B/1/12 |
| EP | 367 224 A2 | | 5/1990 | ............ H01B/1/12 |
| EP | 425 677 | | 5/1991 | ............ C09D/5/00 |
| JP | 59169577 A | * | 9/1984 | ............ B05D/5/12 |
| JP | 61-157541 | | 7/1986 | ............ C08K/9/02 |
| JP | 62-18481 | | 1/1987 | ............ C09D/5/24 |
| JP | 62-018481 | * | 1/1987 | ............ C09D/5/24 |
| JP | 62-197473 | * | 9/1987 | ............ C09D/5/24 |
| JP | 63-046258 | * | 2/1988 | ......... C08L/101/00 |
| WO | WO 96/06437 | | 2/1996 | ............ H01B/1/08 |
| WO | WO 97/32936 | | 9/1997 | ............ C09D/5/10 |
| WO | WO 99/39839 | | 8/1999 | ............ B05D/1/04 |

OTHER PUBLICATIONS

Nippon Seisen Co, NASLON Steel Fiber Data, 1970.*
Kirk–Othomer, "Powder Coatings", in Encyclopedia of Chemical Technology, Wiley–Interscience Publication, 1982, vol. 19, Edition, pp. 1–27.*
Abstract of JP 6 3046258 from on–line base esp@cenet.
English language translation of Japanese Laid–Open No. 1988–46258; laid–open date Feb. 27, 1988.
European Search Report EP 01 20 0314, dated Jun. 12, 2001.
Derwent Abstract 004725056 abstracting JP 61–157541.
Derwent Abstract 007062121 abstracting JP 62–18481.
Patent Abstracts of Japan 59–169577.

* cited by examiner

*Primary Examiner*—Mark Kopec
*Assistant Examiner*—Kallambella Vijayakumar
(74) *Attorney, Agent, or Firm*—Lainie E. Parker; David H. Vickrey

(57) ABSTRACT

The invention relates to an electrically conductive powder coating composition having anti-static properties comprising metallic fibers. Further, the coating composition shows effective EMF shielding. Very good results are found when the metallic fibers have an L/D ratio in the range between 5 and 75, wherein L is the length of the fiber and D is the diameter of the fiber. In a preferred embodiment stainless steel fibers are incorporated in the powder coating composition.

15 Claims, No Drawings

CONDUCTIVE COATING COMPOSITION

This patent application claims priority of European patent application No. 01200314.1, filed Jan. 29, 2001.

BACKGROUND OF THE INVENTION

The present invention relates to a conductive and/or anti-static coating composition. Conductive coatings can be used for making conductive films, e.g., for making conductor circuits on printed circuit boards or integrated circuits, or for the shielding against electromagnetic waves, e.g. the shielding of computer apparatus against external electromagnetic interference.

Conductive and/or anti-static coating compositions are known in the art.

U.S. Pat. No. 5,447,791 relates to the preparation of conductive small particles possessing high conductivities. Such micron and sub-micron particles can be used as color toner particles and in conductive powder coatings. In this process a conductive filler is normally added at the start of the polymerisation process. Carbon black and metal oxides such as iron oxides, titanium oxide, tin dioxide and metal powders are used as conductive filler.

WO 99/39839 discloses an electrically conductive powder coating containing a transparent or white conductive powder such as zinc oxide powder or tin dioxide powder doped with antimony or an inorganic powder coated with tin dioxide powder doped with antimony. The coating film has a volume specific resistance in the range of $10^7$ to $10^{13}$ $\Omega\cdot$cm.

In EP 425 677 an electrically conductive coating is disclosed comprising an electron-beam curable resin and an electrically conductive fine powder having an average particle diameter of 1 to 50 $\mu$m. The electrically conducive powder can be a metallic powder, e.g. gold, silver, copper, nickel, chromium, palladium, aluminium, tungsten, molybdenum or platinum, inorganic or organic powders coated with these metallic powders, powders of metal oxide, carbon black or graphite. Conductive powder coatings are not disclosed in this publication.

WO 96/06437 relates to electroconductive powders based on tin oxide doped with tantalum, niobium or phosphorus that can be used in coatings. The powders can be used to prepare transparent, conductive films and impart electrical conductivity and anti-static properties.

In WO 97/32936 a powder coating is disclosed comprising zinc powder, zinc flakes and/or graphite having a minimum conductivity of 3 $\Omega/cm^2$.

In U.S. Pat. No. 5,556,576 conductive polymeric coatings are disclosed comprising a fine conductive powder, for example, metal powders, metal coated mircobeads of glass, ceramics and carbon black or graphite of appropriate particle size. Conductive powder coatings are not disclosed in this publication.

In JP 62-197473 a solventborne coating composition comprising a synthetic resin and metal fibers is disclosed. In view of present day legislation, solventborne coatings are less desired in view of the non VOC-compliant solvents that are present in these coating compositions. Conductive powder coatings are not disclosed in this publication.

In JP 62-018481 a solventborne coating composition comprising a synthetic resin and metal fiber fillers is disclosed. In view of present day legislation, solventborne coatings are less desired in view of the non VOC-compliant solvents that are present in these coating compositions. Conductive powder coatings are not disclosed in this publication.

In JP 61-157541 a conductive filler is disclosed comprising glass fibres that are chemically coated with nickel. The filler is used in combination with ABS resin to prepare conductive housing for electric applicances. Conductive powder coatings are not disclosed in this publication.

In EP 0 367 224 an electroconductive coating material is disclosed containing a conductive organic fiber. Metallic fibres and conductive powder coatings are not disclosed in this publication.

A major disadvantage of coating compositions known in the art is that either they can not be used as white coatings or that they cannot be used as powder coatings. Normally, the conductive particles that are present in the composition give the composition a grey or greyish appearance, in particular when carbon black or graphite is used as conductive material in the coating, but also when metals or metal oxides as, for example, zinc or zinc oxide are used, after some time a coating with a greyish appearance is obtained. For a number of applications the use of conductive powder coatings with a white appearance is highly desirable.

Surprisingly, it was found that white powder coatings with conductive and/or anti-static properties can be obtained from powder coating compositions comprising metallic fibres. In particular good results are obtained in view of long term stability of the colour of the coating when a powder coating composition comprising stainless steel fibres is used.

SUMMARY OF THE INVENTION

In one embodiment, the invention relates to electrically conductive powder coating compositions having anti-static properties comprising metallic fibres.

In another embodiment, the invention relates to powder coating compositions having stainless steel fibres.

DETAILED DESCRIPTION OF THE INVENTION

For the purpose of the present invention, a fibre is an elongated object with dimensions in two perpendicular directions that are more or less the same and a dimension in the third direction, perpendicular to the other two perpendicular directions, that is larger than in the other two directions, i.e. an object having a certain length and a diameter. If the diameter of the fibre is not constant over Ks length, the diameter D of the fibre equals the average diameter over the whole length (L) of the fibre. When the fibre does not have a circular cross section, the diameter of the fibre equals 2$\times$ SQRT(cross section/$\pi$).

Within the framework of the present invention, metallic fibres include conductive fibres containing metal(s) and/or metal alloy(s), for example, metal fibres containing only one metal or metal-coated non-conductive fibres.

To be able to have a coating with a smooth surface, these fibres should not be too long, but on the other hand, to have good conductive and/or anti-static properties, the fibres should not be too short. It was found that an optimum in these properties is obtained by using metallic fibres with an L/D ratio in the range between 5 and 75, wherein L is the length of the fibre and D is the diameter of the fibre. The diameter of the metallic fibres should normally be in the range from 5 to 25 $\mu$m.

To have a coating with good mechanical properties and appearance, the concentration of the metallic fibres in the coating composition should not be too high. To have an optimum between mechanical properties, appearance and conductive and/or anti-static properties, i was found that the content of metal fibres in the coating composition should be in the range of 0.5 to 20 wt. % based upon the total solids weight in the coating composition. Preferably the content of metallic fibres is in the range of 5 to 15 wt. % based upon the total solids weight in the coating composition.

In EP 286 168 granular plastic composites are disclosed containing metal fibers. These composites can be used for the shaping of thermoplastic articles with antistatic properties or shielding properties against electromagnetic radiation. In order to obtain a reasonable shielding efficiency with a low metallic fiber content (<1% by weight) it is important to maintain in the composite a relatively high L/D ratio for the fibers of ≧100, preferably in the range between 7100 and 2000. In this publication no reference is made to the use of metallic fibres in coatings and the L/D ratio is much larger than the optimum L/D ratio for metallic fibres used in the coating composition according to the present invention.

For larger scale production in an industrial environment, preference is given to the use of coating compositions that are substantially solvent free, e.g., powder coating compositions.

It was found that metallic fibres can be very easily mixed with a normal white powder coating to get a conductive and/or anti-static powder coating composition. However, it is also possible to add the metallic fibres during the manufacturing process of the powder coating composition.

Surprisingly, the presence of the metallic fibres does not have any negative effect on the application of the powder coating via conventional techniques whereby the powder coating particles are electrostatically charged.

In principle any combination known to the man skilled in the art of binders, crosslinkers, additives, fillers, pigments, etc. that are used in known non-conductive powder coating compositions can be used in the conductive powder coating composition comprising metallic fibres according to the present invention. Both thermal curable and radiation curable powder coating compositions can be used.

The conductive powder coating composition according to the present invention can be prepared by mixing and milling all components until a composition with the desired particle size is obtained. Normally, the composition is mixed to the extent that all particles in the composition have a size below 150 μm. However, after the milling of the composition it is normally not sieved, since this could result in the removal of the conductive fibres.

The invention will be elucidated with reference to the following examples. These are intended to illustrate the invention but are not to be considered as limiting in any manner the scope thereof.

EXAMPLES

Conductivity Measurement Procedure

The conductivity of the coating layers was measured using a UNILAP ISO X NORMA Insulation Tester, which is a calibrated 1000 Vdc closed circuit meter.

For the measurements two electrodes are used. Each electrode consists of a brass cube of 50 mm sides and a total weight of 1 kg. A square rubber pad of 5 mm thickness, which has been covered with a thin metal foil, is fixed on the underside to give maximum contact between electrode and substrate.

To measure the conductivity the electrodes are placed onto the same face of the panel spaced apart and a voltage is applied—typically 100 Vdc. The resistance between the two electrodes is then measured. The more conductive the coating, the lower the resistance. In each case, the applied voltage is quoted alongside the measured resistance.

In the examples the following components were used in the preparation of the coating compositions:

| COMPONENT | TYPE | SUPPLIER |
| --- | --- | --- |
| ACEMATT TS 100 | dry flow additive | Degussa |
| Additol VXL9890 | catalyst masterbatch | Solutia |
| ALFTALAT 03580 | polyester resin | Vianova |
| ALFTALAT 03872 | polyester resin | Vianova |
| ALFTALAT AN720 | polyester resin | Vianova |
| ARALDITE GT 7004 | epoxy resin | Ciba |
| Barytes | filler | Viaton Industries |
| Beki-shield GR90 | stainless steel fibres | Bekaert Fibre Technolgies |
| Benzoin | anti-gassing agent | Caffaro |
| BYK-360 P | flow aid | BYK Chemie |
| CAB.551.02 | texturing agent | Eastman Chemical |
| CASAMID 1457 | curing agent/hardener | Thomas Swan |
| D.E.R. 663U-E epoxy | epoxy resin | Dow |
| D.E.R. 692 epoxy | epoxy resin | Dow |
| G.LO 420 iron oxide | pigment | Bayer |
| IRGACURE 184 | initiator | Ciba |
| Irganox 1010 | anti-oxidant | Ciba |
| Licowax PE 520 P | polyethylene wax | Clariant |
| MICRODOL H600 | extender/filler | Norwegian Talc Minerals |
| Titanium Dioxide | pigment | Millenium |
| URACROSS P3125 | polyester resin | DSM |
| URACROSS P3307 | curing agent/hardener | DSM |
| URALAC P5170 | polyester resin | DSM |
| VESTAGON B 68 | hardener/matting agent | Creanova |
| VULCAN XC72 | conductive black pigment | Cabot |

Example 1

(White Epoxy-polyester Coating Over Steel)

Two compositions (1 and 2) were prepared by melt compounding of the following ingredients using an extruder:

| Ingredient | Composition 1 pbw | Composition 2 pbw |
| --- | --- | --- |
| ALFTALAT AN720 |  | 360 |
| ALFTALAT 03580 | 360 |  |
| D.E.R. 692 | 240 | 240 |
| Additol VXL9890 |  | 40 |
| Licowax PE 520 P | 2 | 2 |
| Irganox 1010 | 2 | 2 |
| Benzoin | 2 | 2 |
| Barytes | 254.20 | 115 |
| Stainless Steel Fibres |  | 100 |
| Titanium Dioxide | 130 | 130 |
| Black Pigment | 3.5 | 3.5 |
| G.LO 420 iron oxide | 5 | 5 |
| CAB.551.02 | 0.6 | 0.5 |

An electrically conductive powder coating composition was prepared by melt compounding 90 pbw (parts by weight) of composition 1 and 10 pbw of composition 2 followed by milling of the extrudate to have a particle size of 100% below 150 μm. The powder coating was not sieved, as would usually be the case, since this may have resulted in the removal of the fibres. The powder coating according to the invention was electrostatically sprayed onto mild steel panels and stoved (15 minutes at 180° C.) to give a white coating of 80 μm applied film thickness having a 60° gloss of 33%.

For comparison, a conductive powder coating according to the state of the art was prepared using the following ingredients:

| Ingredient | Composition 4 (pbw) |
|---|---|
| Polyester URALAC P5170 | 21.7 |
| CASAMID 1457 | 2.4 |
| Benzoin | 0.3 |
| Additol VXL9890 | 2.2 |
| BYK-360 P | 0.9 |
| VULCAN XC72 | 7.2 |
| Titanium Dioxide | 7.2 |
| ARALDITE GT 7004 | 36.2 |
| MICRODOL H600 | 21.7 |
| ACEMATT TS 100 | 0.2 |

Composition 5 is a commercial product (RESICOAT 507901), available from Akzo Nobel Powder Coatings (Germany).

Compositions 4 and 5 were also applied to steel panels and cured at elevated temperature.

The conductivity of the coated substrates was measured according to the procedure given above.

In addition to the coated substrates, the conductivity of some non-coated metal substrates was also measured. The results of these test is shown in Table 1

TABLE 1

| Conductivity Testing at 100 V | |
|---|---|
| Sample | Conductivity (Ω) |
| Composition 3 | 22 |
| Composition 4* | 4400 |
| Composition 5* | 7300 |
| Tinplate steel* | 2 |
| Untreated steel* | 2 |
| ZnPO$_4$ steel* | 170 |
| FePO$_4$ steel* | 10 |
| Untreated aluminium* | 2 |
| Chromated aluminium* | 3 |

*) Comparison.

It can be seen from the conductivity testing that the powder coating according to the invention has a surface resistance that is 200 times lower than the best available according to the prior art (an average of 22Ω for Composition 3, compared to an average of 4400Ω for Composition 4).

Example 2
(White Epoxy-polyester Coating Over Steel)

A conducting powder coating composition was prepared by using the following components:

| Ingredient | Composition 6 pbw |
|---|---|
| D.E.R. 663U-E epoxy | 423 |
| BYK-360 P | 11 |
| Benzoin | 6 |
| Black Pigment | 0.37 |
| Blue Pigment | 0.86 |
| Yellow Pigment | 0.46 |
| VESTAGON B 68 | 38 |
| MICRODOL H600 | 58 |
| Titanium Dioxide | 346 |
| ALFTALAT 03872/Steel Fibre Masterbatch | 100 |

-continued

| Ingredient | Composition 6 pbw |
|---|---|
| ALFTALAT 03872 | 15 |
| ACEMATT TS 100 | 1 |

The Steel Fibre Masterbatch was prepared by hot melt compounding of the ALFTALAT polyester resin and steel fibres (Beki-shield GR90) (10:1 w/w) using an extruder. The resulting extrudate was crushed and used as an ingredient for composition 6. Composition 6 was prepared as a powder coating in the same manner as composition 3. Analysis of the powder coating composition revealed that the composition comprises steel fibres with an L/D ratio in the range of 10–50 at a fibre diameter of approximately 10 μm.

Example 3
(Clear UV Curable Coating Over MDF)

Some clear, UV-curable powder coatings were prepared by using the following ingredients:

| Ingredient | Composition 7 pbw | Composition 8 pbw |
|---|---|---|
| URACROSS P3125 | 830 | 730 |
| URACROSS P3125/Steel Fibre Masterbatch | | 100 |
| URACROSS P3307 | 170 | 170 |
| IRGACURE 184 | 10 | 10 |
| BYK-360 P | 10 | 10 |

The Steel Fibre Masterbatch for composition 8 was manufactured in the same manner as that used for composition 6 using the URACROSS polyester resin. Compositions 7 and 8 were prepared as powder coatings in the same manner as composition 3. Compositions 7 and 8 were applied to MDF and cured using a Beltron IR/UV oven at 0.3 m/min track speed, 66/66/0 IR zone dial settings.

Example 4
(Clear UV Curable Coating Over Polycarbonate)

Compositions 7 and 8 were applied to a polycarbonate substrate and cured using a Beltron IR/UV oven at 0.6 m/min track speed, 80/70/20 IR zone dial settings.

TABLE 2

| Conductivity testing at 100 V | |
|---|---|
| Sample | Conductivity (Ω) |
| Composition 6 | 16 |
| Interzinc 52HS (panel 1) | 54 |
| Interzinc 52HS (panel 2) | 26 |
| Polyzinc 660 | 3–8 |

Notes: Interzinc 52HS was applied to steel panels.
Polyzinc 660 was applied to untreated aluminium panels.

Interzinc 52HS is a high solids, low VOC, zinc-rich liquid epoxy primer available from Akzo Nobel International Coatings (UK) Protective Coatings. Polyzinc 660 is available from Akzo Nobel Powder Coatings (France).

Composition 6 has a conductivity comparable with the zinc-rich coatings (Interzinc and Polyzinc), yet is white in colour while the others are limited to grey.

Composition 7 and 8 were applied over insulating substrates. The substrate coated with composition 8 showed improved EMF shielding in comparison to composition

What is claimed is:

1. Electrically conductive powder coating composition having anti-static properties comprising metallic fibres.

2. Powder coating composition according to claim 1 wherein the metallic fibres have an L/D ratio in the range between 5 and 75, wherein L is the length of the fibre and D is the diameter of the fibre.

3. Powder coating composition according to claim 1 wherein the metallic fibres have a diameter in the range from 5 to 25 $\mu$m.

4. Powder coating composition according to claim 1 wherein the metallic fibres are stainless steel fibres.

5. Powder coating composition according to claim 1 wherein the content of metal fibres in the composition is in the range of 0.5 to 20% by weight based upon the total solids weight of the coating composition.

6. Powder coating composition according to claim 5 wherein the content of metal fibres in the composition is in the range of 5 to 15% by weight.

7. Powder coating composition according to claim 2 wherein the metallic fibres have a diameter in the range from 5 to 25 $\mu$m.

8. Powder coating composition according to claim 2 wherein the metallic fibres are stainless steel fibres.

9. Powder coating composition according to claim 3 wherein the metallic fibres are stainless steel fibres.

10. Powder coating composition according to claim 2 wherein the content of metal fibres in the composition is in the range of 0.5 to 20% by weight based upon the total solids weight of the coating composition.

11. Powder coating composition according to claim 3 wherein the content of metal fibres in the composition is in the range of 0.5 to 20% by weight based upon the total solids weight of the coating composition.

12. Powder coating composition according to claim 4 wherein the content of metal fibres in the composition is in the range of 0.5 to 20% by weight based upon the total solids weight of the coating composition.

13. Powder coating composition according to claim 10 wherein the content of metal fibres in the composition is in the range of 5 to 15% by weight.

14. Powder coating composition according to claim 11 wherein the content of metal fibres in the composition is in the range of 5 to 15% by weight.

15. Powder coating composition according to claim 12 wherein the content of metal fibres in the composition is in the range of 5 to 15% by weight.

* * * * *